US010136547B1

(12) United States Patent
Cecire

(10) Patent No.: US 10,136,547 B1
(45) Date of Patent: Nov. 20, 2018

(54) RETRACTING LATCH

(71) Applicant: ALCATEL-LUCENT CANADA INC., Ottawa (CA)

(72) Inventor: Yoan E. Cecire, Oxford Mills (CA)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 15/631,514

(22) Filed: Jun. 23, 2017

(51) Int. Cl.
*H05K 7/14* (2006.01)
*H05K 7/18* (2006.01)
*H05K 7/20* (2006.01)
*H05K 9/00* (2006.01)
*H05K 7/00* (2006.01)

(52) U.S. Cl.
CPC ....... *H05K 7/1489* (2013.01); *H05K 7/20736* (2013.01); *H05K 9/0007* (2013.01); *H05K 9/0062* (2013.01); *H05K 7/00* (2013.01); *H05K 9/00* (2013.01)

(58) Field of Classification Search
CPC .... H05K 7/1489; H05K 7/20736; H05K 7/00; H05K 9/0007; H05K 9/0062; H05K 9/00
USPC .................................................. 361/801–803
See application file for complete search history.

(56) References Cited

U.S. PATENT DOCUMENTS 7,295,447 B2* 11/2007 Strmiska .............. H05K 7/1409
312/223.2
7,397,674 B2* 7/2008 Schlack ............... H05K 7/1409
361/754

* cited by examiner

*Primary Examiner* — Hung S Bui
(74) *Attorney, Agent, or Firm* — Kramer Amado P.C.

(57) ABSTRACT

Disclosed is a switch card assembly and chassis system, including a switch card housing, a latch base adjacent the switch card housing, the latch base including a pivot slot and a control slot, and the latch having a boundary with the chassis, a latch coupled to the latch base, the latch including a plurality of latch toes that move through the boundary of the latch base, and a plurality of pins attached to the latch and slideable within the plurality of slots, wherein the latch is rotated to lock and unlock the switch card housing in the chassis.

20 Claims, 13 Drawing Sheets

RETRACTING LATCH

TECHNICAL FIELD

The invention relates to a latch used to secure cards to chassis assemblies.

SUMMARY

A brief summary of various embodiments is presented below. Some simplifications and omissions may be made in the following summary, which is intended to highlight and introduce some aspects of the various embodiments, but not to limit the scope of the invention. Detailed descriptions of embodiments adequate to allow those of ordinary skill in the art to make and use the inventive concepts will follow in later sections.

Various embodiments include a switch card assembly and chassis system, including a switch card housing, a latch base adjacent the switch card housing, the latch base including a pivot slot and a control slot, and the latch having a boundary with the chassis, a latch coupled to the latch base, the latch including a plurality of latch toes that move through the boundary of the latch base, and a plurality of pins attached to the latch and slideable within the plurality of slots, wherein the latch is rotated to lock and unlock the switch card housing in the chassis.

The plurality of latch toes that move into the chassis when the latch may rotate to a locked position.

The latch may include an insertion toe to press against a first part of the chassis to couple the switch card housing to the chassis.

The latch may include an extraction toe to press against a second part of the chassis to extract the switch card housing from the chassis.

The pivot slot may be substantially straight and the control slot has a radius of curvature.

The control slot may have a first portion having a radius of curvature and a second portion that extends away from the first portion.

One of the plurality of pins may be a pivot pin and the latch may rotate about the pivot pin in a bottom portion of the pivot slot.

In a locked position, a main portion of the latch may be substantially vertical.

The assembly may include a latching block in the chassis having a trigger pin thereon, wherein one of the plurality of latch toes abuts the trigger pin to begin rotation of the latch.

Various embodiments also include a method of using a latch with an insertable card of a chassis assembly, including inserting a switch assembly including a switch card housing, and a latch base into the chassis, engaging the latch with the chassis to begin rotation of the latch in the chassis, rotating the latch from an open position to a locked position in which a first toe of the latch engages with a portion of the chassis assembly, and rotating the latch from a locked position to an open position in which a second toe of the latch engages with the chassis to extract the switch assembly from the chassis and the plurality of toes of the latch move within a boundary of the latch base.

Engaging the latch with the chassis may include abutting the first toe of the latch against a trigger pin in the chassis to begin rotation of the latch.

The method may include rotating the latch such that pins on the latch move in a first slot and a second slot of the switch assembly.

The method may include rotating the latch about a pivot pin of the latch in a pivot slot while a control pin of the latch moves along a control slot.

The control slot may include a first portion having a radius of curvature and a second portion extending away from the first portion.

Rotating the latch to the locked position may include rotating a main portion of the latch to be substantially vertical.

Rotating the latch to the open position from the locked position may include rotating the latch about seventy degrees.

Rotating the latch to the locked position may keep actuation forces on the operator below 16 lbs-force.

BRIEF DESCRIPTION OF THE DRAWINGS

Additional objects and features of the invention will be more readily apparent from the following detailed description and appended claims when taken in conjunction with the drawings. Although several embodiments are illustrated and described, like reference numerals identify like parts in each of the figures, in which:

DETAILED DESCRIPTION

Figure 1:
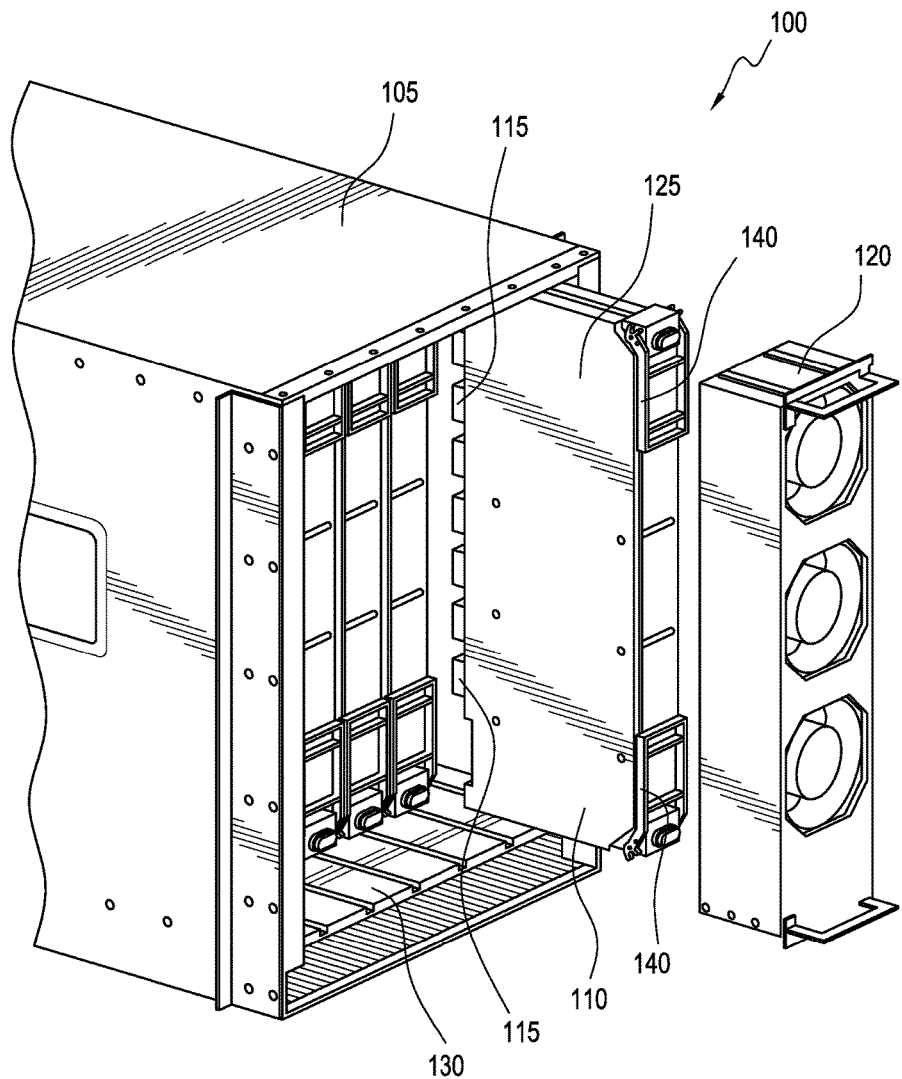
FIG. 1 illustrates a chassis system in accordance with embodiments described herein.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

Embodiments described herein include chassis systems. Because switch cards and fan trays insert into a same section of a chassis, this may involve latching of the switch cards to the chassis. In typical latch designs, a portion of a latch protrudes beyond a physical envelope of a switch, interfering with a guide surface. This compromises the mechanical design of a chassis preventing a switch fabric card and fantray from being inserted into a common area. One solution has been to merge a switch fabric card and fantray into a single unit. This is sub-optimal because a fan failure would require the switch fabric card to be removed and returned to the factory because it is part of the failed fantray.

FIG. 1 illustrates a chassis system 100 in accordance with embodiments described herein. In direct-orthogonal systems, for example, one configuration is to have switch card assemblies 125 inserted into a chassis 105 to connect to a plurality of line cards (not illustrated), with fantrays 120 inserted behind the switch card assemblies 125 towards a rear of the chassis 105. The chassis 105 includes a common guiding surface 130 on which the switch card assemblies 125 and fantrays 120 are guided. The switch card assemblies 125 may include a switch fabric card housing 110 and a latch 140 coupled to a latch base (illustrated in FIG. 2) of the switch fabric card housing 110. The latch 140 may be used to lock and unlock, as well as, insert and extract the switch card assemblies 125 from the chassis 105. The switch card assemblies 125 may be connected to line cards (not illustrated). Switch fabric cards as described herein are one example of switch cards that may be used with line cards. Other switch and support cards may be used to provide data, processing, and power to line cards, and those support cards may be used in place of the switch fabric cards described herein. Likewise, switch fabric card housings may be referred to as switch card housings. On one end of the switch fabric card housings 110 may be a plurality of connectors 115 that connect to the line cards. Due to insertion forces on the connectors 115, the switch card assemblies 125 use latches 140 to keep from requiring more than 16 lbs- actuation force from the latch operator.

Figure 2:
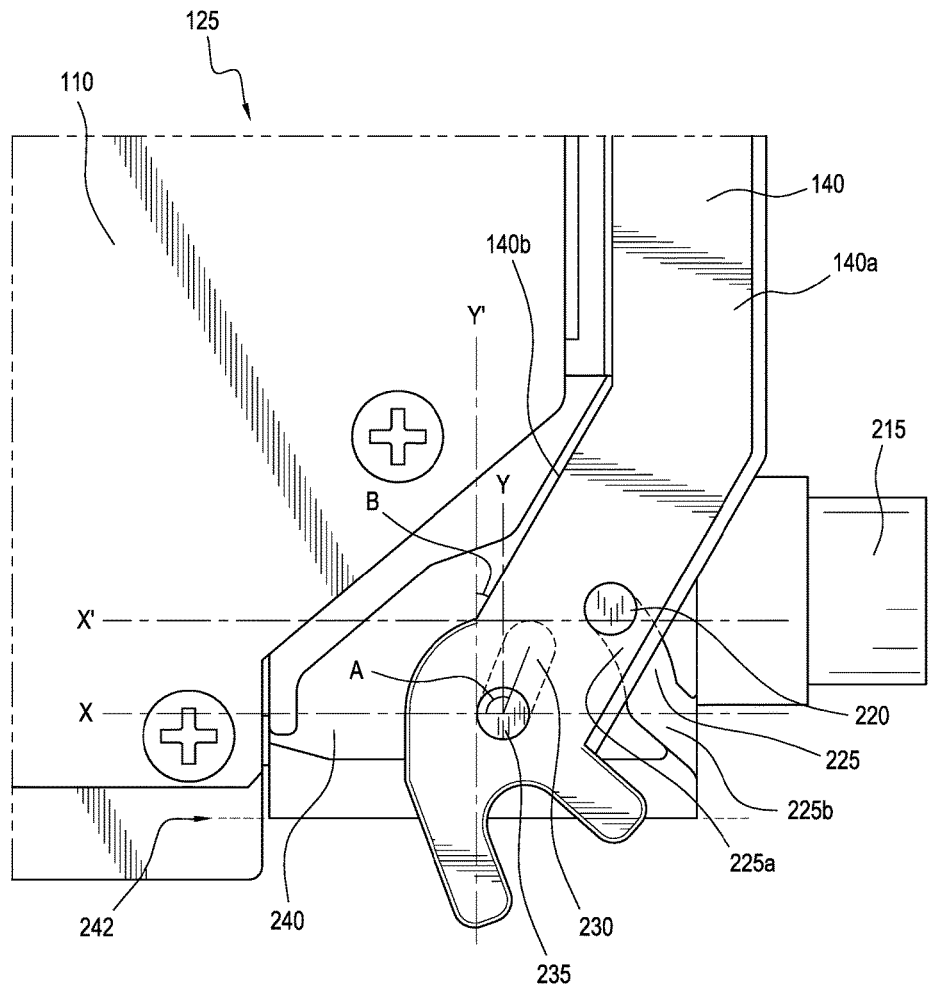
FIG. 2 illustrates a portion of a switch fabric card and a latch in locked position in accordance with embodiments described herein.

FIG. 2 illustrates a portion of a switch fabric card housing 110 and a latch 140 in locked position in accordance with embodiments described herein. The latch 140 may be used to provide a mechanical advantage to the user during insertion and extraction of the switch card assembly 125. As described herein, in order to prevent undesired interaction with the common guiding surface 130 of the chassis 105, the latch 140 may move to within a boundary 242 of a latch base 240 of the switch card assembly 125 when the latch 140 is fully open. The boundary 242 may be a line of demarcation between the switch card assembly 125 and the common guiding surface 130 of the chassis 105. This configuration allows the switch card assembly 125 to slide into and out of the chassis 105 without impediment from the latch 140. Retraction of the latch 140 within the boundary 242 of the latch base 240 allows the design and implementation of a common guiding surface for both the switch fabric card housing 110 and the fantray 120. The switch card assembly 125 may include a fantray connector 215 to connect to the fantray 120. The latch base 240 may be a component connected to the switch fabric card housing 110 or may be formed integrally therewith in the switch card assembly 125.

To facilitate movement of the latch 140 into the boundary 242 of the latch base 240, a plurality of pins on the latch 140 interact with a plurality of slots on the latch base 240. More specifically, as illustrated in FIG. 2, the latch 140 may include a pivot pin 235 and a control pin 220 both affixed to the latch 140. The pivot pin 235 and the control pin 220 are positioned a fixed distance apart on the latch 140. The pivot pin 235 is configured to move within a pivot slot 230 in the latch base 240, and the control pin 220 is configured to move within a control slot 225 in the latch base 240. The pivot slot 230 may be straight from one end thereof to another. The pivot slot 230 may extend in a substantially vertical direction, on the order of about 110 degrees from the horizontal in the X-Y axis, as indicated by angle "A" in FIG. 2. The pivot slot 230 and the control slot 225 may be grooves formed in the sides of the latch base 240 of the switch fabric card housing 110. The pivot slot 230 and control slot 225 are illustrated with dotted lines to indicate their placement behind the latch 140, in the latch base 240.

The control slot 225 may be of a substantially vertical orientation, arcing towards the pivot slot 230. The control slot 225 may have a first portion 225a having an arced portion with a radius of curvature and a second portion 225b extending away from the arced portion 225a. FIG. 2 illustrates a left side of the latch 140 from the perspective of FIG. 1. As illustrated in FIG. 1 when viewed from an insertion direction, the latch 140 includes a first side to the left of the switch card assembly 125 and a second side to the right of the switch card assembly 125. The first side and second sides of the latch 140 are connected by three cross pieces. Other numbers of cross pieces may be used. For convenience and for the most part, the left side of the latch 140 will be illustrated and described. Embodiments described herein also apply to the right side of the latch 140, unless stated otherwise. Similarly, descriptions for the latch 140 that is disposed at a bottom of the latch 140 adjacent the common guiding surface 130 of the chassis 105, may be generally inverted and applied to the latch 140 disposed at a top of the switch card assembly 125.

In a locked configuration of the latch 140 illustrated in FIG. 2, the pivot pin 235 will be disposed lower than the control pin 220. In an unlocked or open configuration of the latch 140 (illustrated in FIG. 6), the pivot pin 235 will be disposed above the control pin 220.

FIG. 2 illustrates a locked position of the latch 140. The latch 140 may include an angled arm portion 140b and a main body portion 140a. As indicated by the Cartesian graph with coordinate axes X'-Y', the angled arm portion 140b may start at an angle "B", approximately 30 degrees from the Y'-axis. The locked position of the latch 140 may start where the main body portion 140a of the latch 140 is in a substantially vertical position. Beginning movement of the latch 140 away from the switch fabric card housing 110, the pivot pin 235 may be a pivot point for the latch 140 and the control pin 220 may control a position of the pivot point of the latch 140 within the pivot slot 230.

Figure 3:
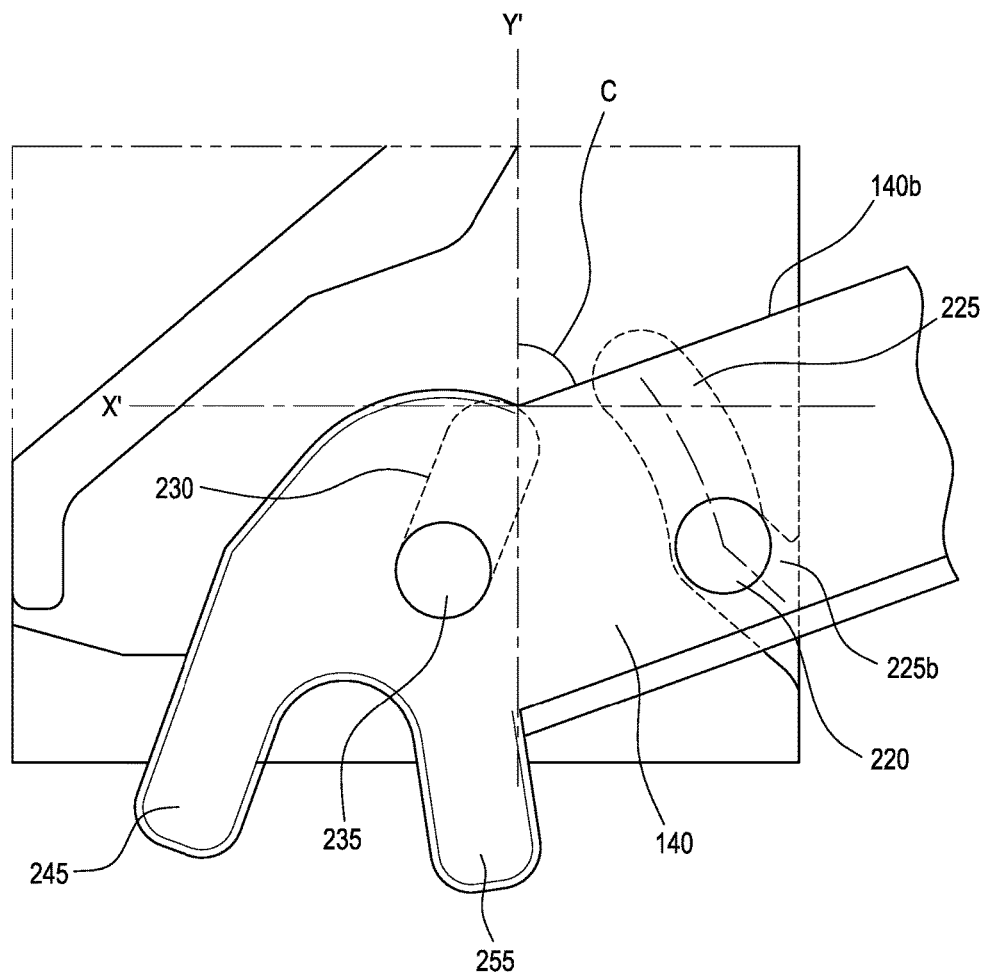
FIG. 3 illustrates a side view of the latch when a pivot pin is in the bottom of a pivot slot in accordance with embodiments described herein.
Figure 6:
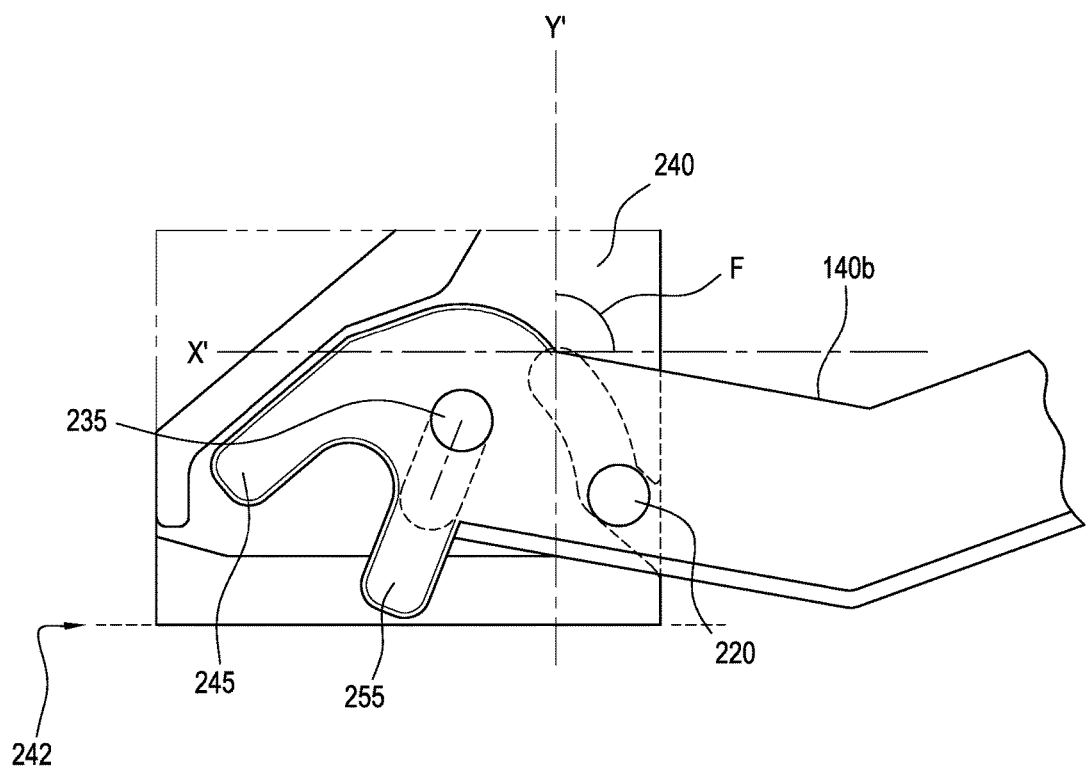

FIG. 3 illustrates a side view of the latch 140 when the pivot pin 235 is in the bottom of the pivot slot 230 in accordance with embodiments described herein. For about a first 40 degrees of rotation of the latch 140, movement of the control pin 220 within the first portion 225a of the control slot 225 forces the pivot point and the pivot pin 235 to remain in a bottom of the pivot slot 230 as illustrated in FIG. 3. The pivot slot 230 may have a predetermined length such that an insertion toe 245 and an extraction toe 255 of the latch 140 may be rotated within the boundary 242 of the latch base 240 (as illustrated in FIG. 6). A geometry of the control slot 225 is designed to factor in rotation of the latch 140 when the pivot pin 235 is disposed at a bottom of the pivot slot 230. The latch 140 may initially rotate about this pivot point at the bottom of the pivot slot 230 because the first portion 225a of the control slot 225 is an arc. Once the control pin 220 enters into the second portion 225b of the control slot 225 that is an arc centered on the bottom of the control slot, the control pin in combination with movement of the latch 140 may force the pivot pin 235 from the bottom of the pivot slot 230.

Figure 4:
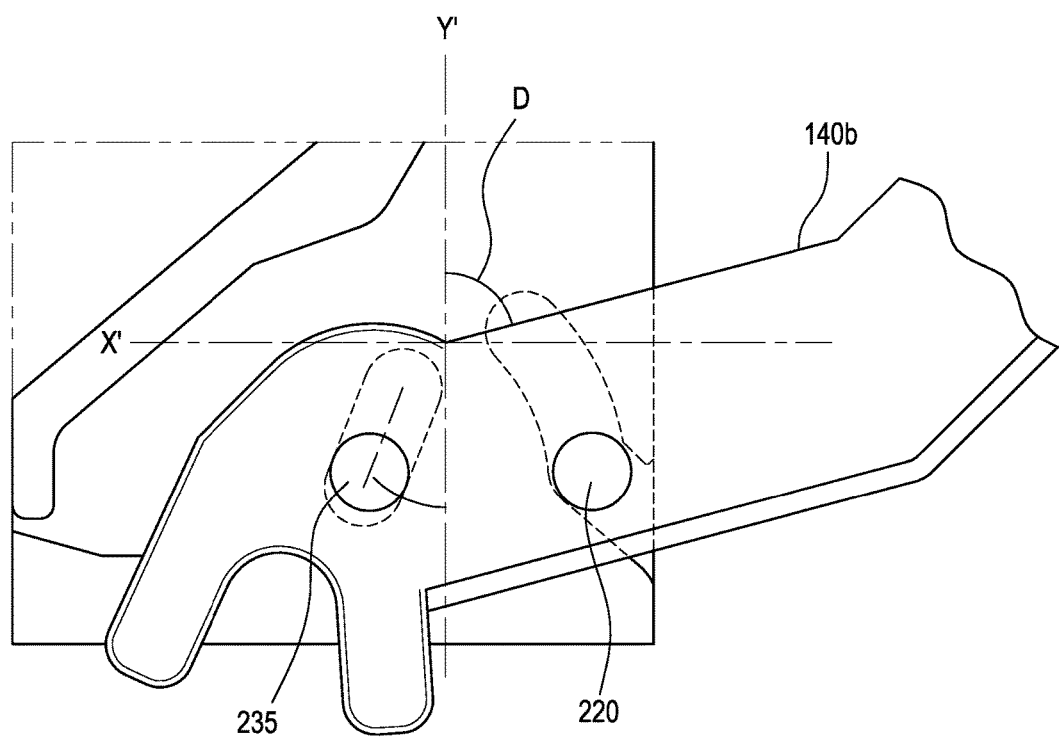
FIGS. 4-6 illustrate movement of a pivot pin and control pin in accordance with embodiments described herein.
Figure 5:
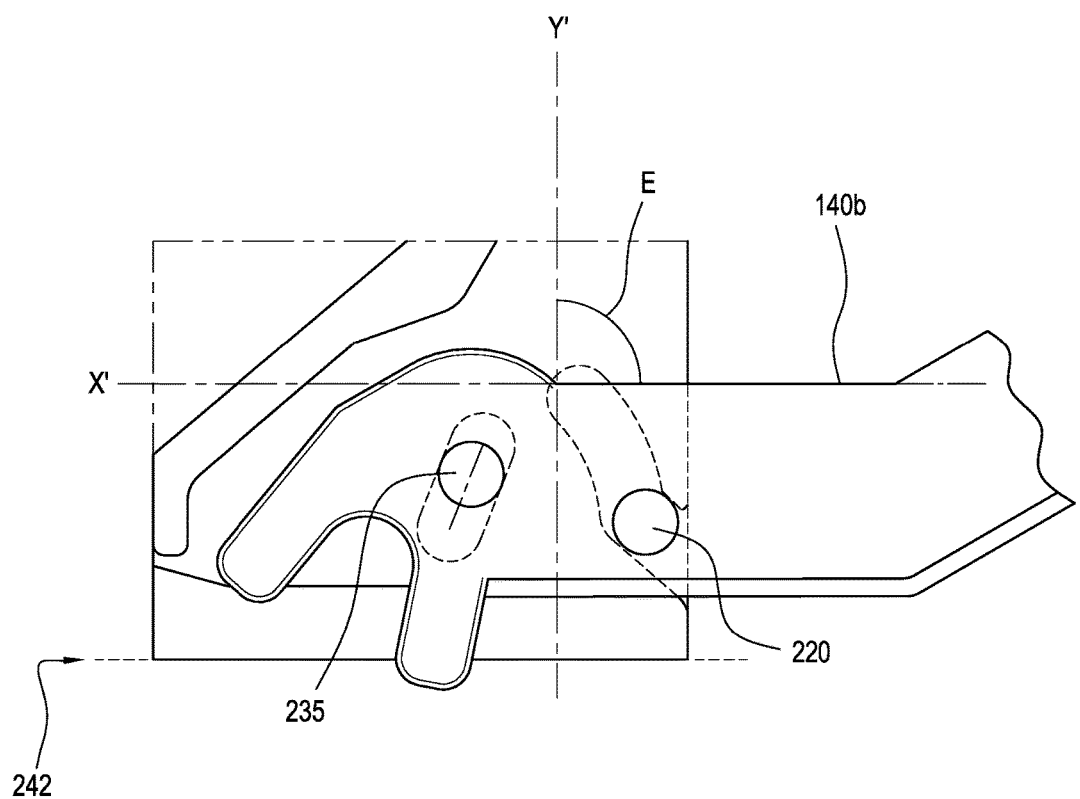

FIGS. 4-6 illustrate movement of the pivot pin 235 and control pin 220 in accordance with embodiments described herein. As the control pin 220 transitions into the second portion 225b of the control slot 225, the functions of the pivot pin 235 and the control pin 220 switch. That is, pivot point of the latch 140 begins to shift to the control pin 220 as the pivot pin 235 within the pivot slot 230 is forced to move upwards in the pivot slot 230 and thus acts as a control point. These movements raise the latch 140 until it is fully within the boundary 242 of the latch base 240 (illustrated in FIG. 6) of the switch fabric card housing 110 as the latch 140 continues to rotate downward. As a result, both the insertion toe 245 and the extraction toe 255 of the latch 140 are completely moved past the boundary 242 of the latch base 240 and will not interfere with a common guiding surface 130 of the chassis 105 when the switch fabric card housing 110 is inserted or extracted from the chassis 105. As the angled arm portion 140b moves through several angles of rotation, a final angle "F" may be about 100 degrees from the positive Y' axis, which would be about a 70 degree rotation of the latch 140 between a locked position and an open position. For a frame of reference, other angles include angle "C" (FIG. 3) at about 70 degrees, angle "D" (FIG. 4) at about 75 degrees, and angle "E" (FIG. 5) at about 90 degrees, all taken from the positive Y' axis.

Figure 7:
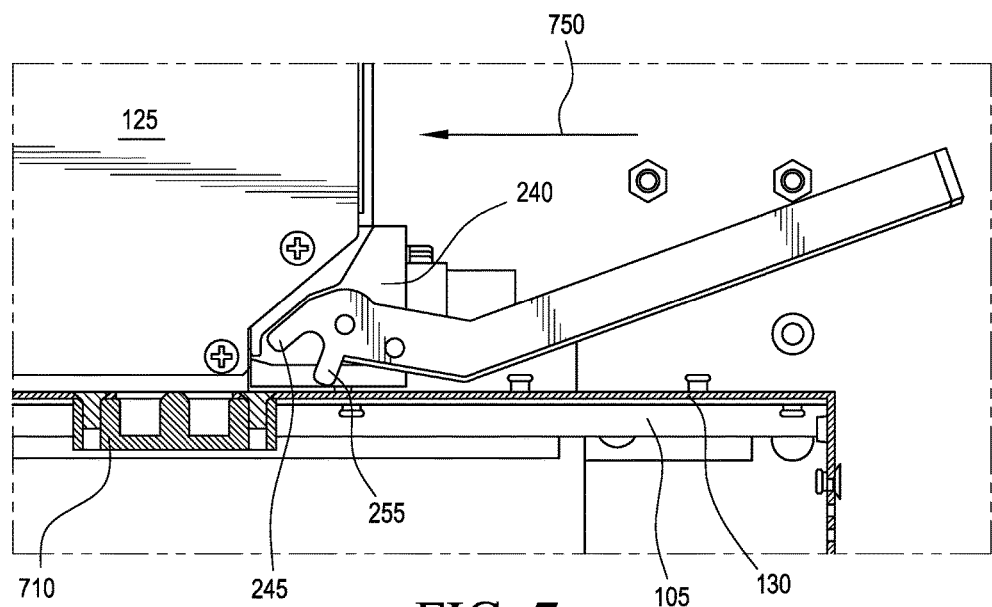
FIG. 7 illustrates an insertion position of a switch card assembly in accordance with embodiments described herein.

FIG. 7 illustrates an insertion position of the switch card assembly 125 in accordance with embodiments described herein. According to embodiments described herein, the insertion toe 245 and the extraction toe 255 of the latch 140 are so labeled because they may be used for insertion and extraction of the switch fabric card housing 110. FIG. 7 illustrates the switch fabric card housing 110 and latch 140 before being coupled to a line card (not illustrated). The arrow 750 indicates the direction of insertion. When the latch 140 is in an open position, the insertion toe 245 and extraction toe 255 are recessed within the boundary 242 of the latch base 240 of the switch fabric card housing 110, such that they will not interfere with the common guiding surface 130 of the chassis 105. The chassis 105 includes a latching block 710 to which the latch 140 including the insertion toe 245 and extraction toe 255 will interact during insertion and extraction of the switch card assembly 125. The insertion toe 245 and the extraction toe 255 aid in the insertion and extraction of the switch fabric card housing 110, overcoming connection and disconnection forces, providing mechanical advantages to the user.

Figure 8:
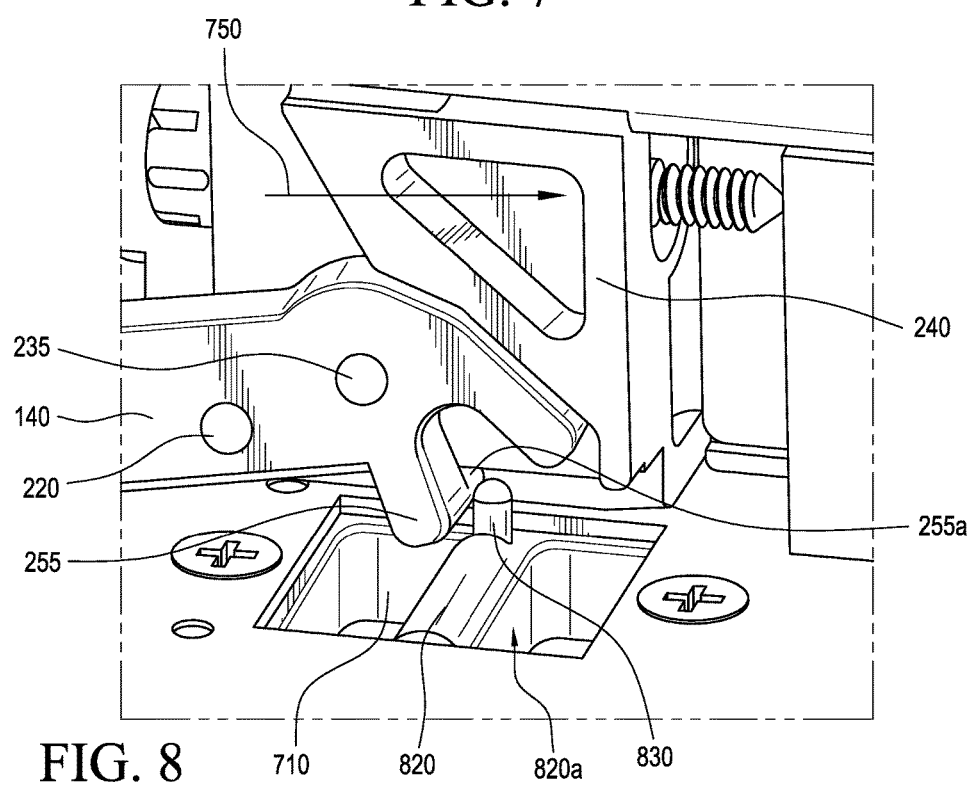
FIG. 8 illustrates interaction between an extraction toe and a latching block in accordance with FIG. 7.

FIG. 8 illustrates interaction between an extraction toe 255 and the latching block 710 in accordance with FIG. 7. FIG. 8 illustrates a right side of the latch 140. As illustrated in FIG. 8, the latching block 710 includes a trigger pin 830 to interact with the extraction toe 255 as the latch 140 is inserted in the insertion direction 750. Insertion of the switch card assembly 125 continues until the latch 140 makes contact with the trigger pin 830. This prevents further switch card assembly insertion until the latch 140 is rotated. The trigger pin 830 may force the end user to begin rotating the latch 140 at a proper position relating to the latching block 710. Without the trigger pin 830 it is possible to over-insert the switch card assembly 125 and miss a latching point, causing the latch 140 to bind.

The extraction toe 255 may have an extended portion 255a to make contact with the trigger pin 830. As noted above, the latch 140 has two sides thereof, disposed on either side of a switch fabric card housing 110, and on either side of the latch base 240. The latching block 710 may extend within the chassis 105 entirely under the switch fabric card housing 110 to interact with the two sides of the latch 140. Also the latching block 710 may be two separate pieces disposed in the chassis 105, the two separate pieces of the latching block 710 respectively interacting with each side of the latch 140. The trigger pin 830 may be disposed on the latching block 710 on either side of the switch fabric card housing 110, or on both sides of the switch fabric card housing 110. As illustrated in FIG. 8, the trigger pin 830 is disposed on a right side of the switch fabric card in the insertion direction 750. Thus in FIGS. 7 and 9-14, with a left side of a latch 140 being illustrated, the entire trigger pin 830 is not fully seen.

As illustrated in FIG. 8, before the extraction toe 255 of the latch 140 makes contact with the trigger pin 830, the pivot pin 235 is disposed above the control pin 220 as described herein. The extraction toe 255 slows a forward movement of the switch card assembly 125 and the interaction with the trigger pin 830 starts a rotation of the latch 140 about a ridge 820 of the latching block 710. A far side of the ridge 820 in the insertion direction may be designated an insertion side 820a, and a near side of the ridge 820 may be designated an extraction side 820b (illustrated in FIG. 9).

Figure 9:
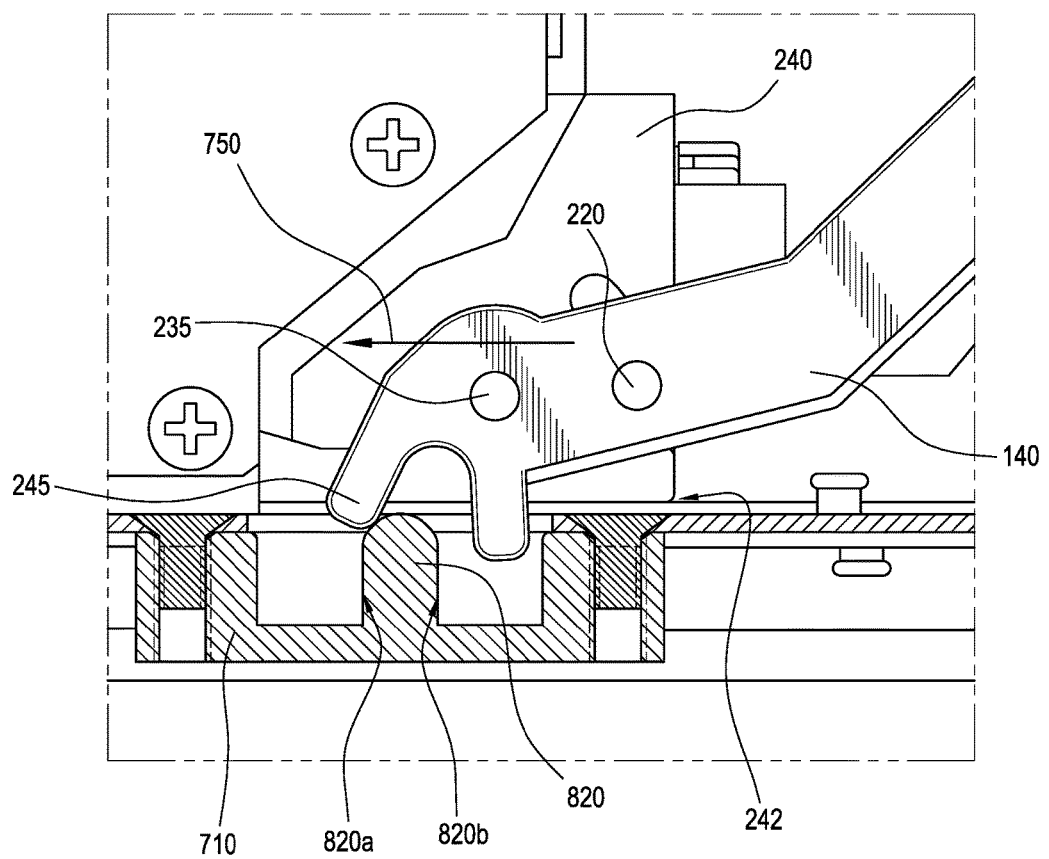
FIG. 9 illustrates a position of a switch card assembly as a latch is lifted into a locked position in accordance with embodiments described herein.

FIG. 9 illustrates a position of the switch card assembly 125 as the latch 140 is lifted into a locked position in accordance with embodiments described herein. The insertion toe 245 makes contact with a top portion of the insertion side 820a of the ridge 820 as the latch 140 moves downward out of the boundary 242 of the latch base 240. At the same time, the pivot pin 235 of the latch 140 moves down within the pivot slot 230 as the latch 140 rotates about the control pin 220. The downward movement of the pivot pin 235 causes the insertion toe 245 and the extraction toe to move downward within the latching block 710. As the latch 140 rotates about the ridge 820, the extraction toe 255 becomes disengaged with the ridge 820 and the insertion toe 245 becomes engaged with the ridge 820.

Figure 10:
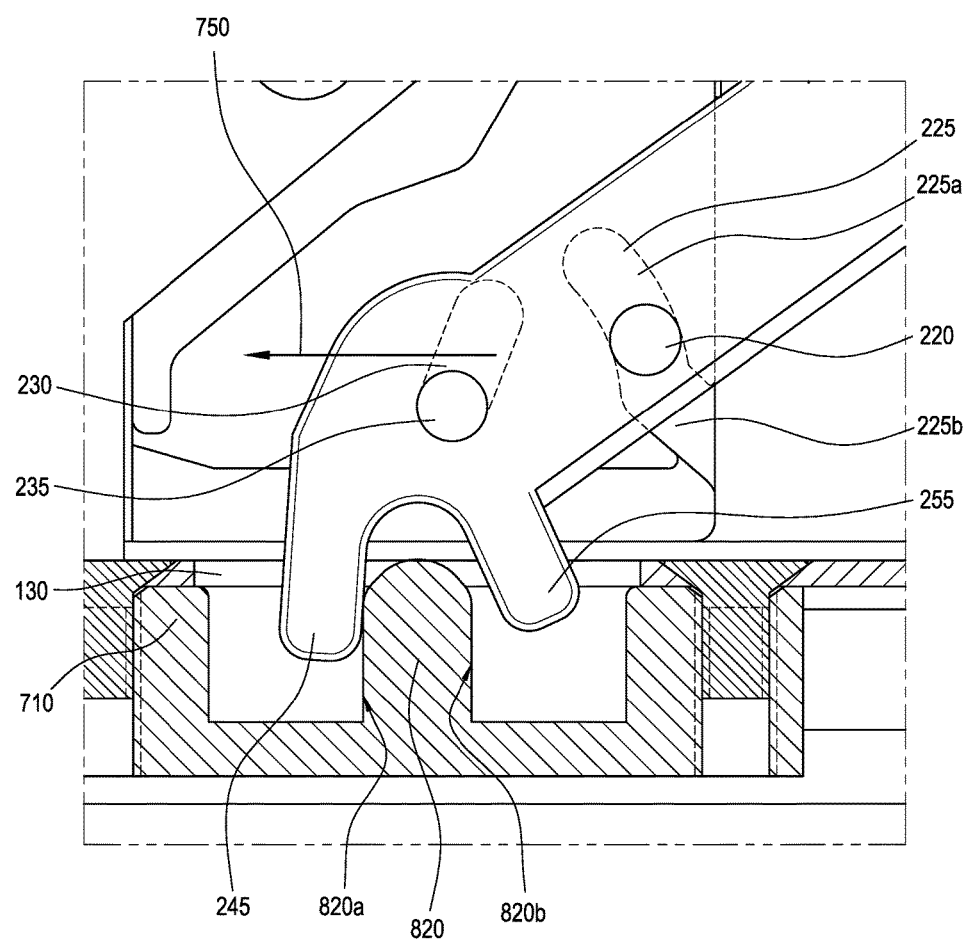
FIG. 10 illustrates further coupling of the latch with the latching block in accordance with FIG. 9.

FIG. 10 illustrates further coupling of the latch 140 with the latching block 710 in accordance with FIG. 9. As illustrated in FIG. 10, as a user continues to lift the latch 140, the pivot pin 235 moves to a bottom of the pivot slot 230 and the control pin 220 shifts out of the second portion 225b of the control slot 225 into the arced first portion 225a of the control slot 225. As this movement of the pins in the slots takes place, the insertion toe 245 is continuing to press against the insertion side 820a of the ridge 820 and move down further into the latching block 710. As the control pin 220 moves above the pivot pin 235, the extraction toe 255 moves upward as the latch 140 rotates. This combination of movements of the various components overcomes the connection force of the connectors 115 as well as any friction between the switch fabric card housing 110 and the common guiding surface 130 of the chassis 105.

Figure 11:
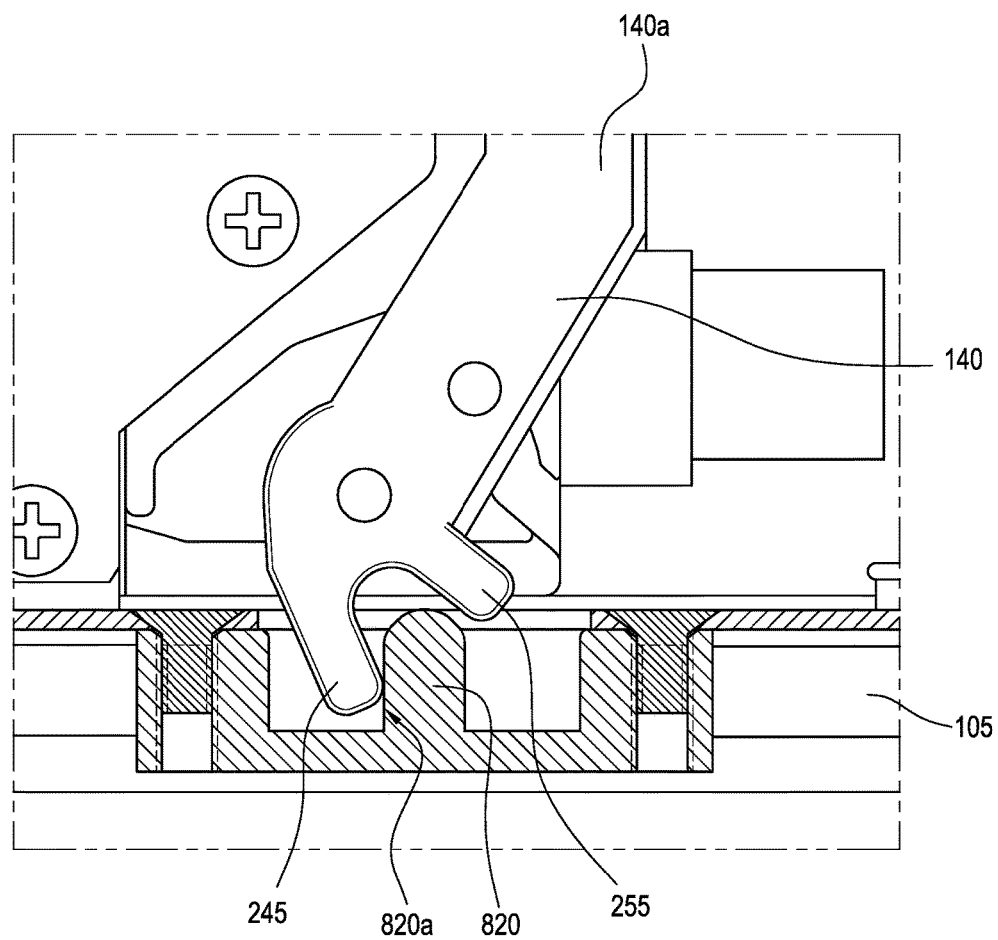
FIG. 11 illustrates a latch in a locked position completely inserted in a chassis in accordance with embodiments described herein.

FIG. 11 illustrates the latch 140 in a locked position completely inserted in the chassis 105 in accordance with embodiments described herein. FIG. 11 is similar to FIG. 2 where the main body portion 140a of the latch 140 is oriented in a vertical position. The insertion toe is disposed in a lower portion of the latching block 710 in contact with the insertion side 820a of the ridge 820, and the extraction toe 255 is above an upper surface of the latching block 710.

Figure 12:
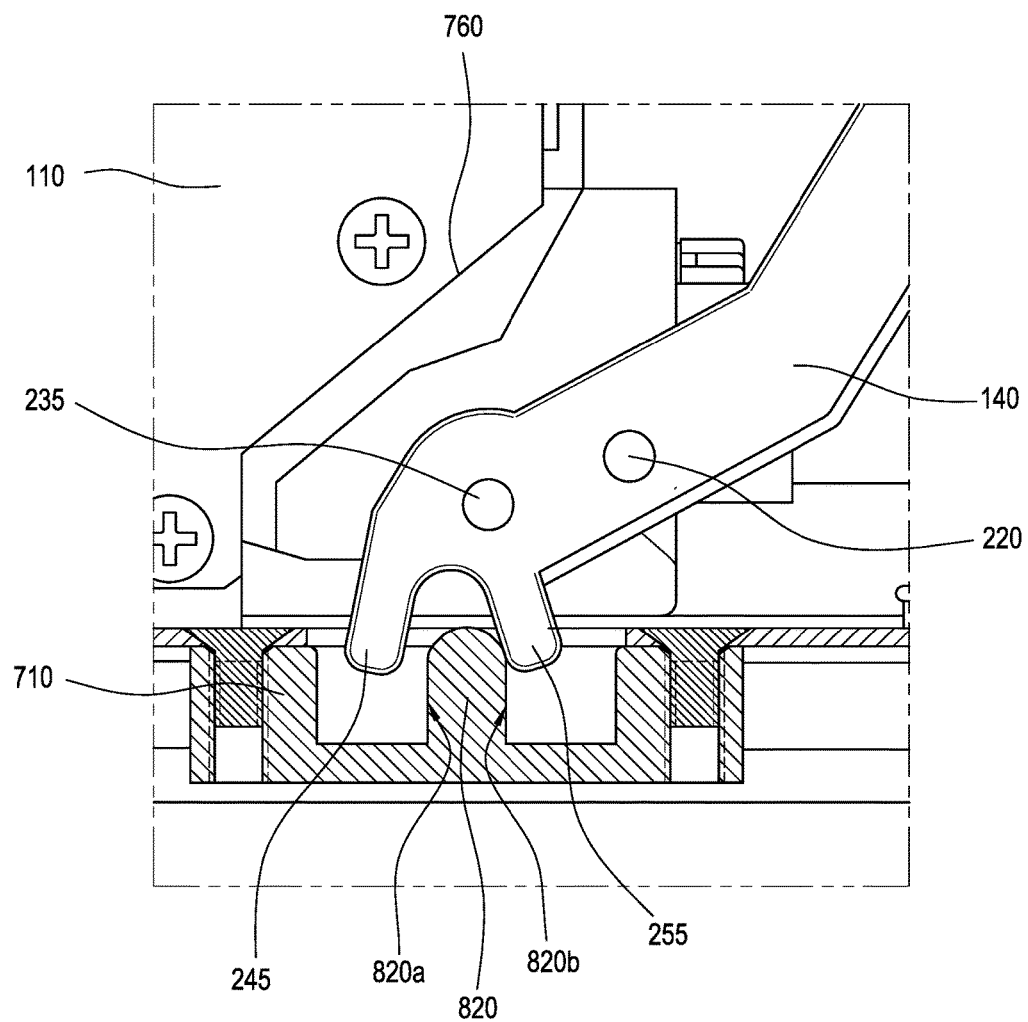
FIG. 12 illustrates a stage of extraction as a latch and switch card fabric are disengaged from a line card in accordance with embodiments described herein.

FIG. 12 illustrates a stage of extraction as the latch 140 and switch fabric card housing 110 are disengaged from a line card (not illustrated) in accordance with embodiments described herein. Extraction from the chassis 105 may be in the direction 760 of the arrow. As the latch 140 is pulled down by a user, the insertion toe 245 disengages with the insertion side 820a of the ridge 820 of the latching block 710 and the extraction toe 255 engages with the extraction side 820b of the ridge 820 to extract the switch card assembly 125 from the chassis 105. As described with reference to FIG. 2 and elsewhere, the latch 140 pivots about the pivot pin 235 as the control pin 220 moves down the curved arc of the control slot 225 (not illustrated).

Figure 13:
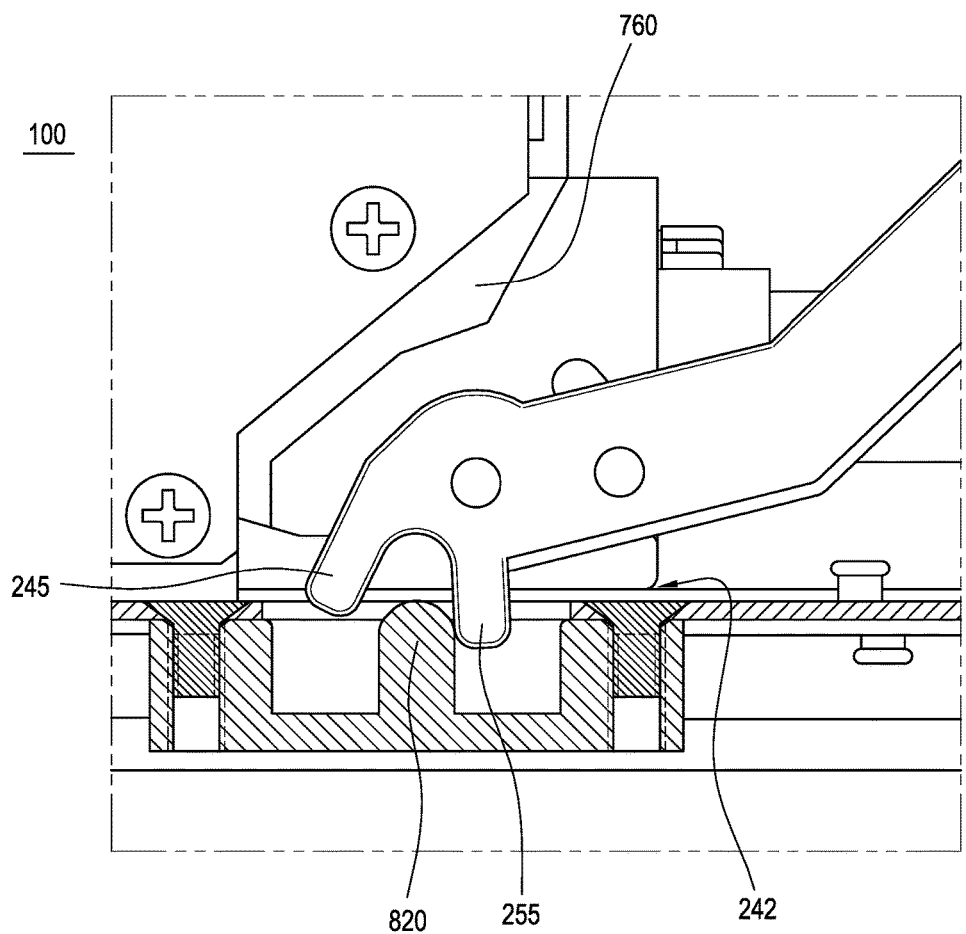
FIG. 13 illustrates further engagement by the extraction toe with an extraction side of a ridge of the latching block in accordance with FIG. 12.

FIG. 13 illustrates further engagement by the extraction toe 255 with the extraction side 820b of the ridge 820 of the latching block 710 in accordance with FIG. 12. In FIG. 13, as the latch 140 is rotated downwards, the insertion toe 245 moves up towards the boundary 242 latch base 240, and the ridge 820 continues to act as a fulcrum point with the extraction toe 255 to extract the switch assembly 125 from the connectors of the line card (not illustrated). As the latch 140 is pivoted towards an insertion area of the chassis, a user rotates the latch 140 and the extraction toe 255 ejects the switch card assembly 125 from the latching block 710. When extracting the switch card assembly 125, resistance is encountered by the connectors 115, and the latch 140 enables the switch card assembly 125 to overcome the resistance.

Figure 14:
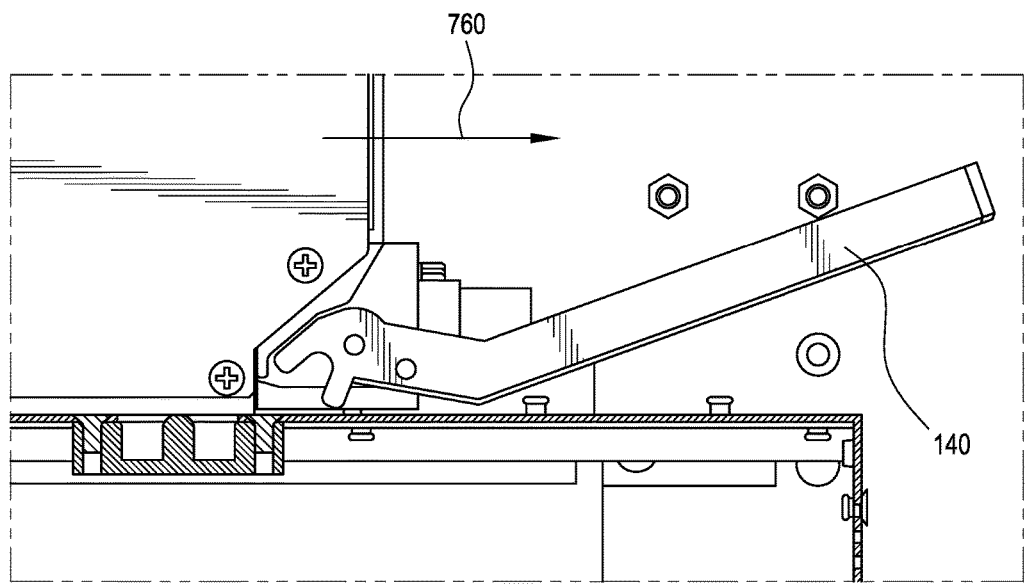
FIG. 14 illustrates the switch card assembly after being extracted from the line card of the chassis in accordance with embodiments described herein.

FIG. 14 illustrates the switch card assembly 125 after being disconnected from the line card of the chassis 105 in accordance with embodiments described herein. In FIG. 14, the latch 140 is completely in an open position, the insertion toe 245 and extraction toe 255 are recessed past the boundary 242 and into the latch base 240, and the switch card assembly 125 can be smoothly extracted from the chassis 105 without the latch toes 245, 255 or the latch 140 interfering with the common guiding surface 130 of the chassis 105. According to embodiments described herein, opening the latch 140 allows the latch 140 to be flush with an insertion position, and closing the latch 140 engages the latch with the latching block 710. The latching block 710 allows the latch 140 to rotate when it reaches a proper position with the chassis 105, preventing over insertion of the switch fabric card housing 110.

Because the latch 140 rotates within the boundary 242 of the latch base 240 of the switch card assembly 125, both the fantray 120 and the switch card assembly 125 can slide on the same common guiding surface 130 in the chassis 105. This may make insertion of the switch card assembly 125 more intuitive to the customer while avoiding the disavanatages of a combined switch card assembly 125 and fantray 120. Because the latches 140 are located on ends of the switch card assembly 125, they are highly visible.

Additional embodiments may make the switch card assembly smaller than the fantray section in the chassis. This may allow latches to protrude beyond the envelope of the switch card assembly while not interfering with the fantray section of the chassis.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

The invention claimed is:

1. A switch card assembly and chassis system, comprising:
 a switch card housing,
 a latch base adjacent the switch card housing, the latch base including a pivot slot and a control slot, and the latch base having a boundary with the chassis; and
 a single latch arm coupled to the latch base, the single latch arm including a plurality of latch toes that move through the boundary of the latch base and a plurality of pins configured to be slideable within the pivot slot and the control slot,
 wherein the single latch arm is rotated such that at least one of the plurality of latch toes engages the chassis to lock or unlock the switch card housing in the chassis.

2. The assembly of claim 1, wherein the plurality of latch toes move into the chassis when the single latch arm rotates to a locked position.

3. The assembly of claim 1, wherein the single latch arm comprises an insertion toe to press against a first part of the chassis to couple the switch card housing to the chassis.

4. The assembly of claim 1, wherein the single latch arm comprises an extraction toe to press against a second part of the chassis to extract the switch card housing from the chassis.

5. The assembly of claim 4, wherein the pivot slot is substantially straight and the control slot has a radius of curvature.

6. The assembly of claim 5, wherein the control slot has a first portion having a radius of curvature and a second portion that extends away from the first portion.

7. The assembly of claim 1, wherein one of the plurality of pins is a pivot pin and the single latch arm rotates about the pivot pin in a bottom portion of the pivot slot.

8. The assembly of claim 1, wherein in a locked position, a main portion of the single latch arm is substantially vertical.

9. The assembly of claim 1, further comprising a latching block in the chassis and having a trigger pin thereon, wherein one of the plurality of latch toes abuts the trigger pin to begin rotation of the single latch arm.

10. A method of using a singe latch arm having pins thereon with an insertable card of a chassis assembly, comprising:
 inserting a switch assembly including a switch card housing, and a latch base into the chassis;
 engaging the single latch arm with the chassis to begin rotation of the single latch arm in the chassis;
 rotating the singe latch arm from an open position to a locked position in which a first toe of the single latch arm engages with a portion of the chassis assembly and the pins rotate within the latch base; and rotating the single latch arm from a locked position to an open position in which a second toe of the single latch arm engages with the chassis to extract the switch assembly from the chassis and the plurality of toes of the single latch arm move within a boundary of the latch base.

11. The method of claim 10, wherein engaging the single latch arm with the chassis includes abutting the first toe of the single latch arm against a trigger pin in the chassis to begin rotation of the single latch arm.

12. The method of claim 10, further comprising rotating the single latch arm such that the pins on the single latch arm move in a first slot and a second slot of the switch assembly.

13. The method of claim 10, further comprising rotating the single latch arm about a pivot pin of the single latch arm in a pivot slot while a control pin of the single latch arm moves along a control slot.

14. The method of claim 13, wherein the control slot includes a first portion having a radius of curvature and a second portion extending away from the first portion.

15. The method of claim 10, wherein rotating the single latch arm to the locked position includes rotating a main portion of the single latch arm to be substantially vertical.

16. The method of claim 10, wherein rotating the single latch arm to the open position from the locked position includes rotating the single latch arm about seventy degrees.

17. The method of claim 10, wherein rotating the single latch arm to the locked position keeps actuation forces on the operator below 16 lbs-force.

18. A switch card assembly and chassis system, comprising:
   a switch card housing,
   a latch base adjacent the switch card housing, the latch base including a pivot slot and a control slot, and the latch base having a boundary with the chassis;
   a latch coupled to the latch base, the latch including a plurality of latch toes that move through the boundary of the latch base;
   a plurality of pins attached to the latch and slideable within the plurality of slots, wherein the latch is rotated to lock or unlock the switch card housing in the chassis; and
   a latching block in the chassis and having a trigger pin thereon, wherein one of the plurality of latch toes abuts the trigger pin to begin rotation of the latch arm.

19. The assembly of claim 18, wherein the latch comprises an insertion toe to press against a first part of the chassis to couple the switch card housing to the chassis.

20. The assembly of claim 18, wherein the latch comprises an extraction toe to press against a second part of the chassis to extract the switch card housing from the chassis.

* * * * *